(12) United States Patent
Roohparvar

(10) Patent No.: US 7,057,945 B2
(45) Date of Patent: *Jun. 6, 2006

(54) NON-VOLATILE MEMORY ERASE CIRCUITRY

(75) Inventor: Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/964,037

(22) Filed: Oct. 13, 2004

(65) Prior Publication Data

US 2005/0063218 A1    Mar. 24, 2005

Related U.S. Application Data

(62) Division of application No. 10/816,386, filed on Apr. 1, 2004, now Pat. No. 6,876,583, which is a division of application No. 10/199,718, filed on Jul. 19, 2002, now Pat. No. 6,781,880.

(51) Int. Cl.
    *G11C 7/00*    (2006.01)

(52) U.S. Cl. .............................. 365/189.11; 365/185.18; 365/185.19; 365/236

(58) Field of Classification Search ........... 365/189.11, 365/185.18, 185.33, 185.19, 236
See application file for complete search history.

(56) References Cited

U.S. PATENT DOCUMENTS

| | | | |
|---|---|---|---|
| 4,752,699 A | 6/1988 | Cranford, Jr. et al. | |
| 5,463,588 A | 10/1995 | Chonan | |
| 5,801,987 A | 9/1998 | Dinh | |
| 6,278,639 B1* | 8/2001 | Hosono et al. | 365/189.11 |
| 6,279,070 B1* | 8/2001 | Jeong et al. | 365/218 |
| 6,320,796 B1* | 11/2001 | Voo et al. | 365/189.09 |
| 6,385,093 B1 | 5/2002 | Bautista, Jr. et al. | |
| 6,421,757 B1* | 7/2002 | Wang et al. | 365/185.33 |
| 6,643,181 B1 | 11/2003 | Sofer et al. | |

* cited by examiner

*Primary Examiner*—Huan Hoang
(74) *Attorney, Agent, or Firm*—Leffert Jay & Polglaze, P.A.

(57) ABSTRACT

A non-volatile memory device includes floating gate memory cells, a pulse counter and voltage pump control circuitry. The control circuitry selectively activates pumps in response to a count output of the counter. In one embodiment, the pump output current is increased as the counter output increases. The memory allows for erase operations that reduce leakage current during initiation of an erase operation.

20 Claims, 4 Drawing Sheets

NON-VOLATILE MEMORY ERASE CIRCUITRY

RELATED APPLICATIONS

This application is a divisional of U.S. Ser. No. 10/816,386, filed Apr. 1, 2004 now U.S. Pat. No. 6,876,583, which is a divisional of U.S. Ser. No. 10/199,718 (now U. S. Pat. No. 6,781,880), filed Jul. 19, 2002.

FIELD OF THE INVENTION

The present invention relates generally to non-volatile memory devices and in particular the present invention relates to erase circuitry of non-volatile memory devices.

BACKGROUND OF THE INVENTION

Memory devices can be designed and manufactured using numerous, different materials and storage techniques. For example, volatile dynamic memory devices are typically fabricated using storage capacitors. Data is stored by changing the capacitor charge, and data is retrieved by sensing the stored charge. Volatile static memory devices are designed using latch circuits to store data, and non-volatile memory devices, such as flash, use floating gate transistors to store data.

Erase operations in a Flash memory device typically start by writing a background of zero to all memory locations in an erase block that are to be erased. This operation is referred to as a Pre-program cycle. Then an erase pulse is applied to the block of memory. A memory state machine, or control circuitry, steps through the array and verifies that all locations are erased. If a location is not erased properly, the state machine applies another pulse and then verifies. The erase pulse application and verification steps are repeated until the block is erased.

A problem can be encountered in some flash memory devices due to excessive amounts of current that are drawn during the initial pulses of an erase operation. One technique used to erase memory cells is to apply a positive voltage to the source of the cells and a negative voltage to the control gate of the cells. The negative voltage on the gate further couples negatively an already programmed floating gate of the cell. A tunnel current is formed between the source to the floating gate due to the electric field, and a Gate Induced Drain Leakage current (GIDL). This current is a result of gate diode breakdown of the cell because the floating gate cell has a big negative voltage and the source has a large positive voltage. The electric field in the gate to source area causes a breakdown in the depletion region, which sends some of the current to the memory substrate.

For the reasons stated above, and for other reasons stated below which will become apparent to those skilled in the art upon reading and understanding the present specification, there is a need in the art for improved erase circuitry for non-volatile memory devices.

SUMMARY OF THE INVENTION

The above-mentioned problems with non-volatile memory and other problems are addressed by the present invention and will be understood by reading and studying the following specification.

In one embodiment, a non-volatile memory device comprises an array of memory cells, a counter circuit coupled to count voltage pulses applied to the memory cells, a voltage pump circuit to generate an elevated voltage output from an input voltage, and control circuitry to adjust a current sourced by the voltage pump in response to an output of the counter circuit.

In another embodiment, a flash memory device comprises an array of floating gate memory cells, a first voltage pump coupled to produce an output voltage from an input voltage, a second voltage pump coupled in parallel to the first voltage pump to produce the output voltage from the input voltage, a counter to maintain a running count of voltage pulses applied to the array during erase and program operations, and control circuitry coupled to the first and second voltage pumps and the counter. The control circuit selectively activates the first and second voltage pumps in response to the running count of the counter.

A method of operating a pump circuit of a memory device comprises activating a first plurality of parallel voltage pumps while an output count of a counter circuit is equal to or less than X counts, such that the activated pumps provides an output voltage with a first current limit. The first plurality of pumps and a second plurality of pumps are activated while an output count of the counter circuit is greater than X counts, such that the first and second pumps provide the first output voltage with a second current limit that is greater than the first current limit.

A method of erasing a flash memory cell comprises applying a negative voltage to a control gate of the flash memory cell, and applying a series of positive voltage pulses to a source of the flash memory cell. A current limit of the positive voltage pulses increases based upon the number of positive voltage pulses applied.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
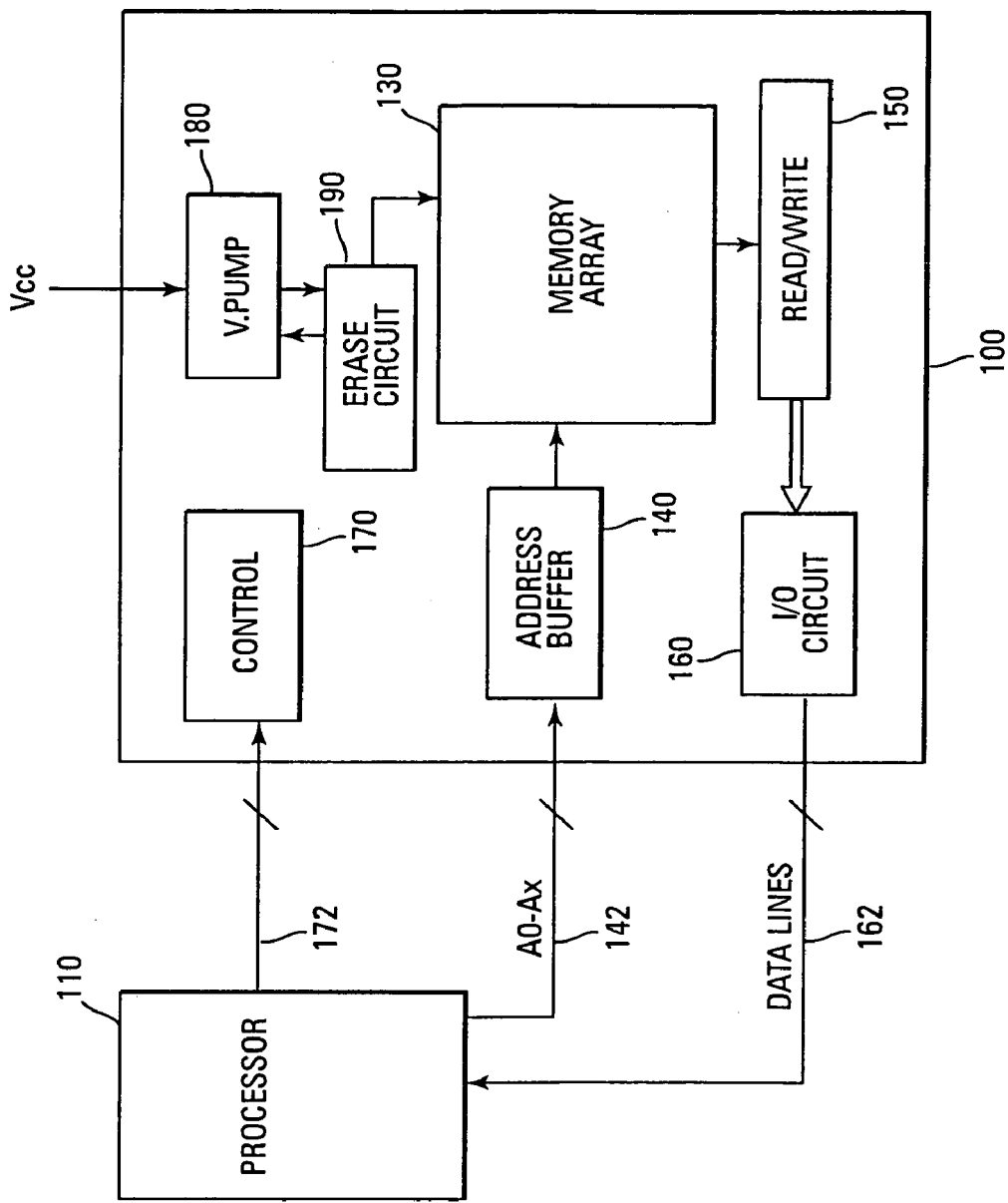
FIG. 1 is a functional block diagram of a memory device of one embodiment of the present invention.

FIG. 1 is a functional block diagram of a memory device 100, of one embodiment of the present invention, which is coupled to a processor 110. The memory device 100 has been simplified to focus on features of the memory that are helpful in understanding the present invention. The memory device includes an array of memory cells 130. The memory cells are preferably non-volatile floating-gate memory cells and generally have their control gates coupled to word lines, drain regions coupled to local bit lines, and source regions commonly coupled to a ground potential. The memory array 130 is arranged in banks of rows and columns. Each bank is arranged in erase blocks. During an erase operation, the memory cells of the erase block are placed in an erased state. Data, however, may be stored in the memory array 130 separate from the block structure.

An address buffer circuit 140 is provided to latch address signals provided on address input connections A0–Ax 142. Address signals are received and decoded to access the memory array 130. It will be appreciated by those skilled in the art, with the benefit of the present description, that the number of address input connections depend upon the density and architecture of the memory array. That is, the number of addresses increases with both increased memory cell counts and increased bank and block counts.

The memory device reads data in the array 130 by sensing voltage changes in the memory array columns using sensing circuitry 150. The sensing circuitry, in one embodiment, is coupled to read and latch a row of data from the memory array. The row data can be one continuous address, or comprised of partial rows of discontinuous addresses.

Data input and output buffer circuitry 160 is included for bi-directional data communication over a plurality of data (DQ) connections 162 with the processor 110. The timing of data communication can vary depending upon the architecture. Command control circuit 170 decodes signals provided on control connections 172 from the processor 110. These signals are used to control the operations on the memory array 130, including data read, data write, and erase operations. During operation, commands are provided on the control connections, such as ACTIVE, READ and WRITE commands. An ACTIVE command is used to open (or activate) a row in a particular array bank for a subsequent access. A selected row generally remains active for accesses until the next ACTIVE command. The READ command is used to initiate a read access to an active row. The address connections are used to select a starting column location. Read data appears on the DQs subject to a read latency value. A WRITE command is used to initiate a single-location write access on an active row. Input data appearing on the DQs is written to the memory array.

A voltage pump circuit 180 is provided to generate voltages used in erase and program operations. In one embodiment the supply, Vcc, is used as an input voltage and an elevated voltage output is generated. An erase circuit 190 is provided to erase the memory cells of the array. As explained below, the erase circuit adjusts the output current sourced by the voltage pump during an erase operation.

The flash memory device has been simplified to facilitate a basic understanding of the features of the memory. A more detailed understanding of internal circuitry and functions of flash memories are known to those skilled in the art.

Figure 2:
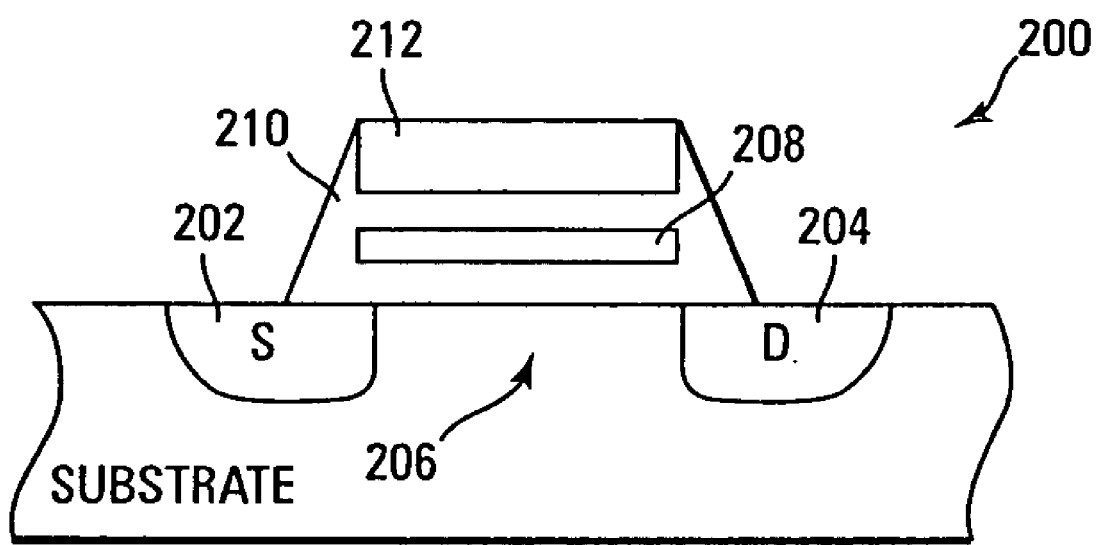
FIG. 2 is a cross-section of a prior art non-volatile memory cell.

Referring to the cross-section of FIG. 2, a prior art non-volatile memory cell is fabricated as a floating gate memory cell 200 and include a source region 202 and a drain region 204 that is spaced apart from the source region to form an intermediate channel region 206. A floating gate 208, typically made of doped polysilicon, is disposed over the channel region and is electrically isolated from the other cell elements by oxide 210. For example, gate oxide can be formed between the floating gate and the channel region. A control gate 212 is located over the floating gate and is can also made of doped polysilicon. The control gate is also electrically separated from the floating gate by dielectric. Thus, the floating gate is "floating" in dielectric so that it is insulated from both the channel and the control gate.

Table 1 shows example typical prior approaches to programming, reading and erasing (two approaches) of a flash memory cell. The voltages are for an embodiment using a primary supply voltage VCC for the memory of +3.8 volts. The conditions for programming use a high positive gate voltage Vg, such as +10 volts, a moderate positive drain voltage Vd of +4 to +6 volts, and the source voltage Vs and the substrate voltage Vsub are held at ground level. Other embodiments of the present invention can use different values and the present invention is not limited to the values of Table 1.

TABLE 1

|  | PROGRAM | READ | ERASE 1 | ERASE 2 |
| --- | --- | --- | --- | --- |
| Control Gate (Vg) | +10 | +3.8 | Ground | −10 to −17 |
| Drain (Vd) | +4 to +6 | +1 | Float | Float |
| Source (Vs) | Ground | Ground | +12 | +5 |
| Substrate (Vsub) | Ground | Ground | Ground | Ground |

Table 1 also shows the conditions for reading the memory cell. Here, the control gate voltage Vg is connected to the primary supply voltage VCC of +5 volts. In addition, the drain voltage Vd is set to a small positive voltage of +1 volts and the source voltage Vs is set to ground potential. If the cell were in a programmed state, the excess electrons present on the floating gate would have increased the threshold voltage to a value in excess of +5 volts. Thus, the control gate Vg to source voltage Vs of +5 volts would not be sufficient to turn on the memory cell. That is, current would not be conducted through the channel region. The resultant lack of cell current indicate that the memory cell was in a programmed state. If the memory cell were in an erased state, the threshold voltage of the cell would be substantially below +5 volts. In that case, the cell would conduct current in response to the control gate voltage that would be sensed to indicate that the cell was in the erased state.

Table 1 shows two conventional alternative sets of conditions for erasing a flash cell. In the first example, the control gate voltage Vg is grounded and the drain region is left floating (open), and the source region voltage Vs is connected to a large positive voltage of +12 volts. When these conditions are applied to the cell, a strong electric field is generated between the floating gate 208 and the source region 202. This field causes the electrons on the floating gate to be transferred to the source region by way of Fowler-Nordheim tunneling.

The above conditions for erasing a cell can be disadvantageous in that the large positive voltage (+12 volts) applied to the source region is difficult to implement in an actual memory system. In another approach, a relatively large negative voltage ranging from −10 to −17 volts is applied to the gate during an erase operation. In addition, the primary supply voltage VCC of +5 volts (or less) is applied to the source region while the drain region is left floating.

The program and erase operations are not performed in single steps. That is, successive program pulses are applied to the memory cells to program a memory cell. This approach reduces over-programming. In a similar manner, the erase operation is iterative. In one embodiment, the erase operation includes three primary steps. The first is a pre-program operation in which all of the memory cells of an erase block are programmed. After all of the cells are pre-programmed, successive erase pulses are applied to the memory cells to remove the pre-program charge from the floating gate. A soft-program operation can be performed to 'heal' any over-erased memory cells.

As explained above, prior art erase operations in a Flash memory device are well documented. Because the erase operation repeats the erase pulse application and verification steps, the memory uses a pulse counter to avoid getting caught in this mode forever because some memory bits will not erase. The pulse counter counts the number of erase pulses applied to the array. Once a maximum allowed erase pulse number is reached, the state machine discontinues the erase operation. Typically, the state machine sets a bit in a status register to signify a problem was encountered with the erase operation and the erase operation is completed. Typical erase pulses are in the 10's of millisecond range, and a maximum pulse count for the erase can be set to 1000 pulses. As such, the erase operation could take up to 10 seconds. A more typical erase time, however, is in the order of one second.

A problem can be encountered in some flash memory devices due to excessive amounts of current that are drawn during the initial pulses of an erase operation. The first pulses applied to the memory erase block see an array that if fully programmed where the memory cells of the array to have their most negative threshold levels. The erasure of the cells is done by applying a positive voltage to the source of all the cells in the block and a negative voltage to all the control gates. The negative voltage on the gate further couples the already negative program floating cell. The current that is seen at this point from the source is the combination of the tunnel current that goes from the source to the floating gate due to the electric field. The other component of the current, which is the majority at this point, is the GIDL (Gate Induced Drain Leakage current). This current is a result of gate diode breakdown of the cell. The floating gate cell has a big negative voltage and the source has a large positive voltage. The electric field in the gate to source area causes a breakdown in the depletion region, which sends some of the current to the substrate. As the cell gets erased with the application of successive erase pulses, the negative voltage on the gate becomes less negative and therefore the GIDL current decreases.

Flash memory devices that use a pump circuit 180 to generate the source voltage from a Vcc supply, experience a large peak in the current during the first pulses of the erase operation. The present invention recognizes that the pump current does not need to be large in the first few erase pulse cycles, and that the overall erase time would not be significantly lengthened. One embodiment of the present invention proposes the use of the pulse counter output to reduce the pump current strength for the initial pulses.

Figure 3:
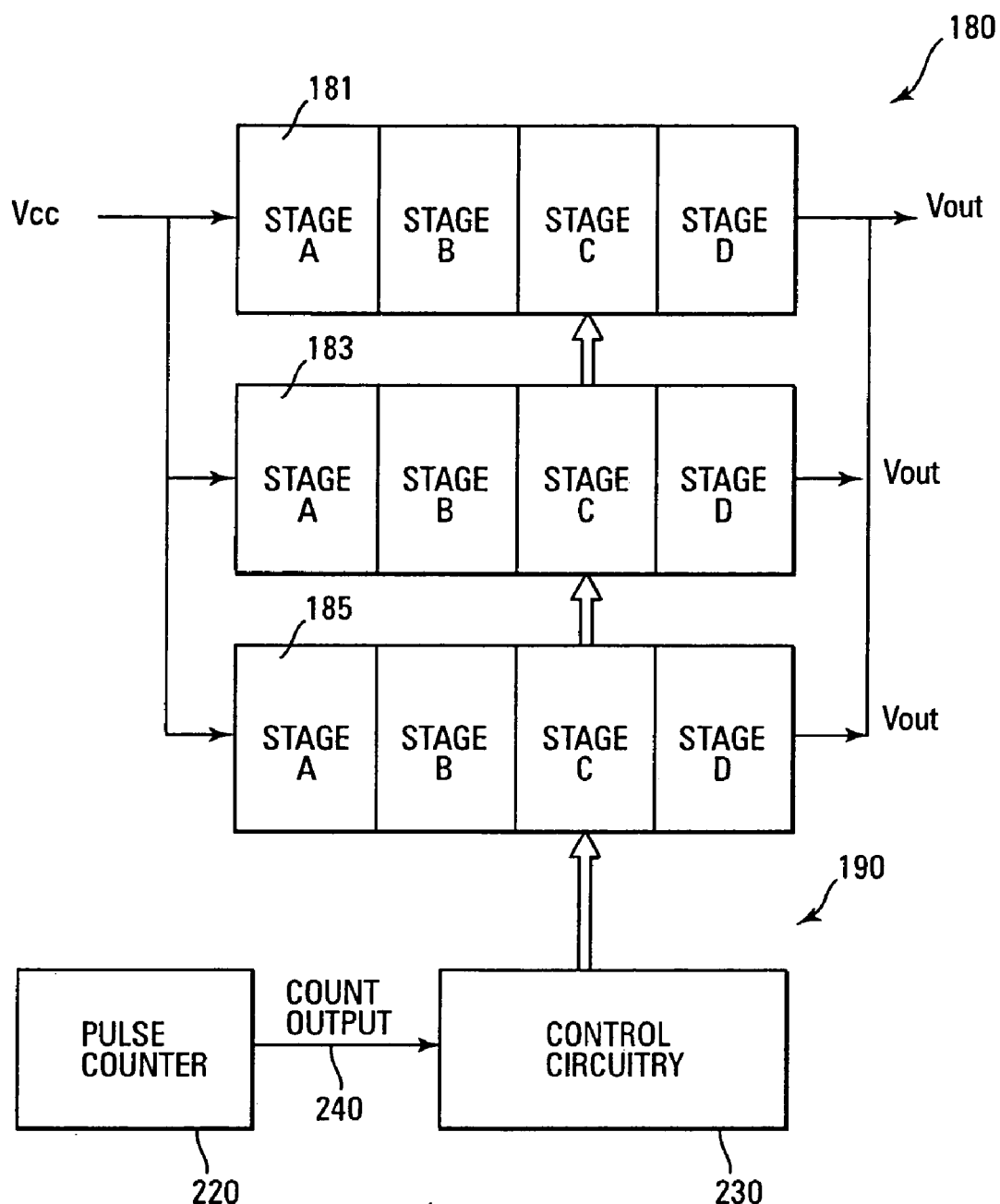
FIG. 3 illustrates circuitry of the non-volatile memory device of FIG. 1.

Referring to FIG. 3, a portion of a non-volatile memory device 100 of FIG. 1 is described in greater detail. A general block diagram of a voltage pump circuit 180 is illustrated. The voltage pump can be any design suitable for generating an output voltage, Vout, from an input voltage, such as Vcc. In the illustrated embodiment, the pump circuit includes several parallel pumps 181, 183 and 185 to provide a Vout voltage. Each pump includes a number of pump stages (stages A–D) are provided to boost the Vcc voltage to Vout. Stages B–D selectively boost an output voltage from a previous stage. Each of the pumps contributes a portion of the output current of the pump circuitry. For example, if the total output current, Iout, of the pump circuitry is 10 mA, five parallel pumps can be used that each provides a 2 mA output current.

The memory device pulse counter 220 output is coupled to erase control circuitry 230 to control the output of the pump circuit 180. The control circuitry can be a state machine, control circuit 170 of the memory, or a separate logic circuit. The control circuitry determines the algorithm to operate the pump circuitry. That is, the number of activated pumps is controlled in response to the pulse counter to limit the current sourced by the pump circuitry. In one embodiment, the pump provides two different output current levels depending upon the pulse count output 240. For example, the pump provides Iout/W during the first X pulses and then increases to Iout/Y for Z pulses. The present invention, however, is not limited by the number of pump output increments. That is, a memory device that uses five parallel pumps can sequentially turn on the five pumps to provide five distinct source current levels.

Figure 4:
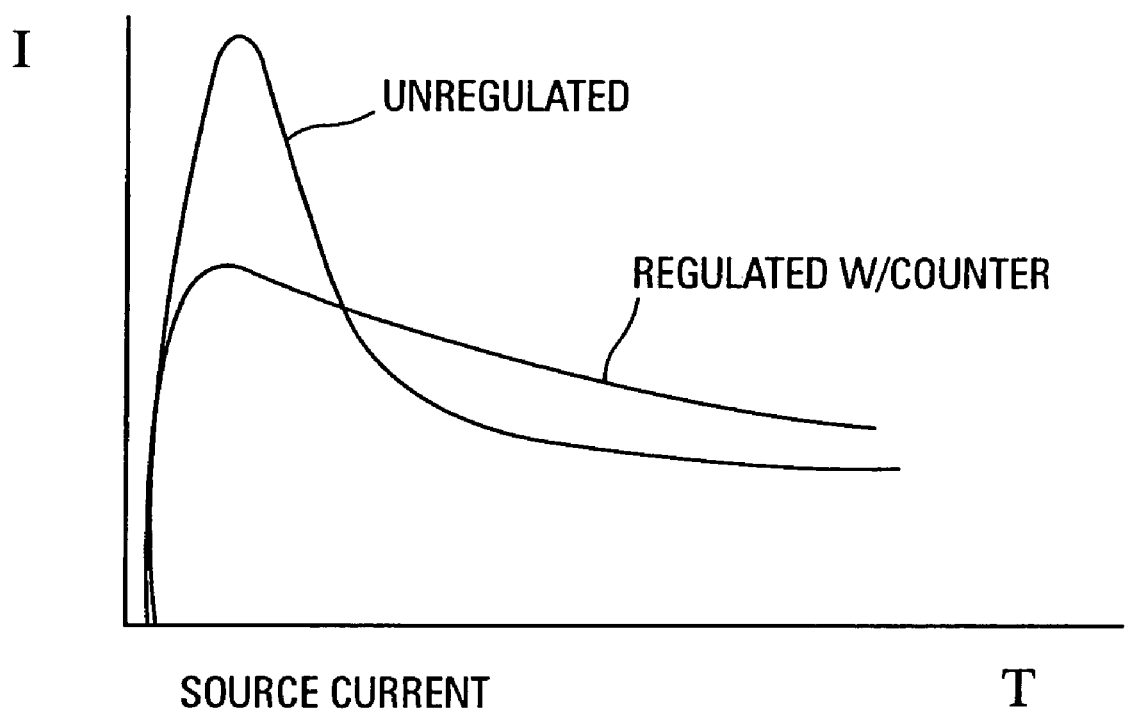
FIG. 4 is a graph of representative source current during an erase operation.

FIG. 4 generally is a representation of the source current obtained using an embodiment of the present invention. The prior unregulated source current includes a high Gate Induced Drain Leakage current that results in large wasted current that can cause reliability problems with the memory cells. The regulated current represents the source current obtained when the counter output is used to regulate the voltage pump. The Gate Induced Drain Leakage current is reduced to provide a current profile that still allows efficient erasure.

CONCLUSION

A non-volatile memory device has been described that includes floating gate memory cells, a pulse counter and voltage pump control circuitry. The control circuitry selectively activates pumps in response to a count output of the counter. In one embodiment, the pump output current is increased as the counter output increases. The memory allows for erase operations that reduce leakage current during initiation of an erase operation.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A method for operating a voltage pump circuit of a memory device, the method comprising:
  activating a first plurality of parallel voltage pumps while an output count of a counter circuit is equal to or less than a predetermined quantity of pulses, such that the activated pumps provides an output voltage with a first current limit; and
  activating the first plurality of pumps and a second plurality of pumps while the output count of the counter circuit is greater than the predetermined quantity of pulses, such that the first and second pumps provide a first output voltage with a second current limit that is greater than the first current limit.

2. The method of claim 1 wherein the output count is provided by a pulse counter of the memory device.

3. The method of claim 1 wherein the memory device is a flash memory device, and the first output voltage is coupled to a source node of floating gate memory devices during an erase operation.

4. The method of claim 1 wherein the first and second plurality of pumps are selectively activated to increase a cumulative output current of the first and second plurality of pumps in response to an increasing running count of the counter circuit.

5. The method of claim 1 wherein the output voltage is 12V.

6. The method of claim 1 wherein the predetermined quantity of counts is 1000.

7. A voltage pump circuit for use in a non-volatile memory device having a pulse counter and erase control circuitry, the voltage pump circuit comprising:
an input coupled to an input voltage; and
a plurality of parallel voltage pumps coupled to the input voltage, each voltage pump comprised of a plurality of stages and generating an output voltage and a variable output current, the output current increasing or decreasing in response to a pulse count output from the pulse counter.

8. The circuit of claim 7 wherein the output voltage is greater than the input voltage.

9. The circuit of claim 7 wherein the input voltage is $V_{CC}$.

10. The circuit of claim 7 wherein the erase control circuitry activates each of the plurality of parallel voltage pumps in response to the pulse count.

11. The circuit of claim 10 wherein the erase control circuitry activates an increasing quantity of parallel voltage pumps as the pulse count increases.

12. The circuit of claim 10 wherein the erase control circuitry initially activates a first voltage pump of the plurality of parallel voltage pumps in response to an initial pulse count at the start of an erase operation and the erase control circuitry activates at least a second voltage pump of the plurality of parallel voltage pumps in response to a second pulse count.

13. A memory system comprising:
a processor for generating memory signals; and
a non-volatile memory device, coupled to the processor, for operating in response to the memory signals, the memory device having a pulse counter coupled to erase control circuitry that controls a voltage pump circuit, the voltage pump circuit comprising:
an input coupled to an input voltage; and
a plurality of parallel voltage pumps coupled to the input voltage, each voltage pump comprised of a plurality of stages and generating an output voltage and a variable output current, the output current increasing or decreasing in response to a pulse count output from the pulse counter.

14. The system of claim 13 wherein a first quantity of the plurality of parallel voltage pumps is activated in response to the pulse count during an initial part of an erase operation.

15. The system of claim 13 wherein a second quantity of the plurality of parallel voltage pumps is activated in response to the pulse count.

16. The system of claim 13 wherein the non-volatile memory device is a flash memory device.

17. The system of claim 16 wherein the flash memory device is comprised of an array of floating gate transistors.

18. The system of claim 13 wherein the erase control circuitry is a state machine.

19. The system of claim 13 wherein the input voltage is $V_{CC}$ and the output voltage is greater than $V_{CC}$.

20. The system of claim 13 wherein the plurality of stages for each voltage pump are arranged in series and each stage boosts an output voltage from a previous stage.

* * * * *